US008908460B2

(12) United States Patent
Mun et al.

(10) Patent No.: US 8,908,460 B2
(45) Date of Patent: Dec. 9, 2014

(54) NONVOLATILE MEMORY SYSTEMS USING TIME-DEPENDENT READ VOLTAGES AND METHODS OF OPERATING THE SAME

(75) Inventors: Kui-Yon Mun, Hwaseong-si (KR); Min-Chul Kim, Suwon-si (KR); Sungwoo Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 206 days.

(21) Appl. No.: 13/473,317

(22) Filed: May 16, 2012

(65) Prior Publication Data

US 2012/0294104 A1 Nov. 22, 2012

(30) Foreign Application Priority Data

May 17, 2011 (KR) .......................... 10-2011-0046380

(51) Int. Cl.
*G11C 7/00* (2006.01)
*G11C 11/56* (2006.01)
*G11C 13/00* (2006.01)

(52) U.S. Cl.
CPC ............ *G11C 11/56* (2013.01); *G11C 11/5628* (2013.01); *G11C 11/5642* (2013.01); *G11C 11/5678* (2013.01); *G11C 11/5685* (2013.01); *G11C 13/0002* (2013.01); *G11C 13/0004* (2013.01); *G11C 13/0007* (2013.01); *G11C 13/0033* (2013.01); *G11C 13/0035* (2013.01); *G11C 13/004* (2013.01); *G11C 13/0061* (2013.01); *G11C 13/0069* (2013.01)
USPC ............... 365/218; 365/189.011; 365/189.05; 365/233.13

(58) Field of Classification Search
CPC ............ G11C 11/156; G11C 11/5642; G11C 11/5678; G11C 11/5628; G11C 11/5685; G11C 13/0035; G11C 13/0007; G11C 13/004; G11C 13/002; G11C 13/0069; G11C 13/0033; G11C 13/0004
USPC .................. 365/218, 189.011, 233.13, 189.05
See application file for complete search history.

(56) References Cited

U.S. PATENT DOCUMENTS

| | | | |
|---|---|---|---|
| 6,915,175 B2 * | 7/2005 | Ahn ................................. | 700/87 |
| 7,382,660 B2 | 6/2008 | Bovino et al. | |
| 7,489,549 B2 | 2/2009 | Mokhlesi | |
| 7,554,879 B2 * | 6/2009 | Ahn ......................... | 365/233.13 |
| 7,558,109 B2 | 7/2009 | Brandman et al. | |
| 8,351,256 B2 * | 1/2013 | Son et al. .................. | 365/185.03 |
| 8,582,360 B2 * | 11/2013 | Park et al. ................ | 365/185.09 |
| 2004/0042331 A1 * | 3/2004 | Ikehashi et al. ............... | 365/232 |
| 2004/0085814 A1 * | 5/2004 | Kawai et al. ............. | 365/185.09 |

FOREIGN PATENT DOCUMENTS

JP 08-235871 9/1996

* cited by examiner

*Primary Examiner* — Pho M Luu
(74) *Attorney, Agent, or Firm* — Myers Bigel Sibley & Sajovec, P.A.

(57) ABSTRACT

An elapsed time with respect to a programming operation on a memory cell of a nonvolatile memory is determined, a read voltage is adjusted based on the determined elapsed time and a read operation is performed on the memory cell using the adjusted read voltage. Determining the elapsed time may be preceded by performing the programming operation in response to a first access request and determining the elapsed time may include determining the elapsed time in response to a second access request. Memory systems supporting such operations are also described.

15 Claims, 13 Drawing Sheets

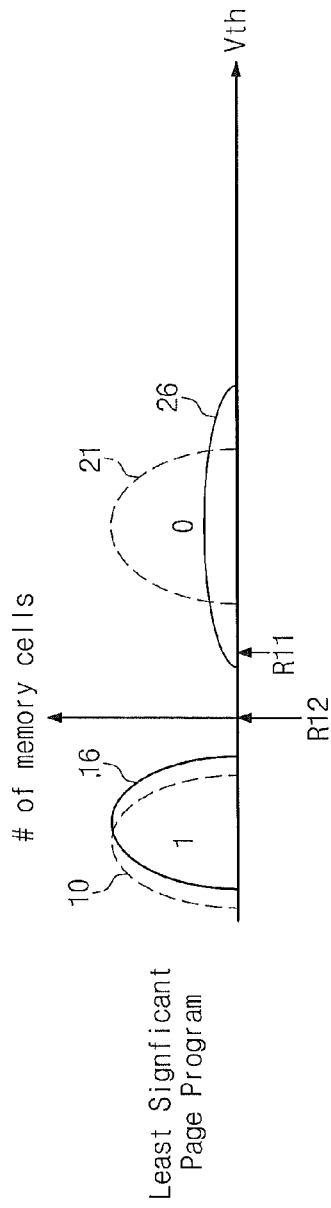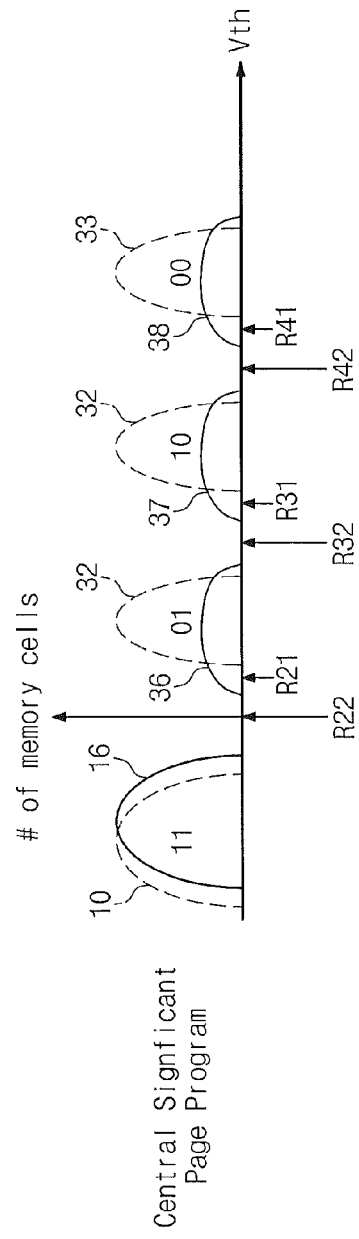

Fig. 8

| Block Number | Access Mark | |
|---|---|---|
| | AM1(LSB) | AM2(CSB) |
| BLK0 | 0 | 0 |
| BLK1 | 1 | 1 |
| ⋮ | ⋮ | ⋮ |
| BLKz | 1 | 0 |

Fig. 9

| | Least Significant Page | Central Significant Page | Most Significant Page |
|---|---|---|---|
| WL4 | 9 | 12 | 14 |
| WL3 | 6 | 10 | 13 |
| WL2 | 3 | 7 | 11 |
| WL1 | 1 | 4 | 8 |
| WL0 | 0 | 2 | 5 |

NONVOLATILE MEMORY SYSTEMS USING TIME-DEPENDENT READ VOLTAGES AND METHODS OF OPERATING THE SAME

CROSS-REFERENCE TO RELATED APPLICATION

This U.S. non-provisional patent application claims priority under 35 U.S.C. §119 of Korean Patent Application No. 10-2011-0046380, filed on May 17, 2011, the entire contents of which are hereby incorporated by reference.

BACKGROUND

The present inventive subject matter relates to semiconductor memory systems and methods of operating the same and, more particularly, to nonvolatile memory systems and methods of operating the same.

Semiconductor memories typically are formed from semiconductor materials, such as silicon (Si), germanium (Ge), gallium arsenide (GaAs), indium phospide. Semiconductor memories may be classified into volatile memories and nonvolatile memories.

Volatile memories typically lose their stored data when power supplies are interrupted. Volatile memories include static random access memory (SRAM), dynamic RAM (DRAM), synchronous DRAM (SDRAM), etc. Nonvolatile memories typically retain their stored data even when power supplies are interrupted. Nonvolatile memories include read only memory (ROM), programmable ROM (PROM), electrically programmable ROM (EPROM), electrically erasable and programmable ROM (EEPROM), flash memory, phase change RAM (PRAM), magnetic RAM (MRAM), resistive RAM (RRAM), ferroelectric RAM (FRAM), etc. Flash memories may be classified as NOR-type flash memories and NAND-type flash memories.

SUMMARY

Some embodiments of the inventive subject matter provide methods in which an elapsed time with respect to a programming operation on a memory cell of a nonvolatile memory is determined, a read voltage is adjusted based on the determined elapsed time and a read operation is performed on the memory cell using the adjusted read voltage. Determining the elapsed time may be preceded by performing the programming operation in response to a first access request and determining the elapsed time may include determining the elapsed time in response to a second access request. The second access request may be a request to program the memory cell and the methods may further include programming the memory cell responsive to the read operation.

In some embodiments, the methods may further include updating an access mark corresponding to the memory cell in conjunction with the programming operation. Determining an elapsed time with respect to a programming operation on a memory cell of a nonvolatile memory device may include determining the elapsed time based on the access mark. The methods may include resetting the access mark responsive to a lapse of a predetermined time following the updating of the access mark without an access request. Lapse of the predetermined time may be determined by reference to the access mark.

According to further embodiments, the methods may include generating a measure of erase operations of the memory cell. Adjusting the read voltage may include adjusting the read voltage based on the determined elapsed time and the measure of erase operations.

A memory system according to some embodiments includes a nonvolatile memory including a plurality of memory cells and a control circuit configured to determine an elapsed time with respect to a programming operation on a memory cell of the nonvolatile memory device, to adjust a read voltage based on the determined elapsed time and to perform a read operation on the memory cell using the adjusted read voltage. The control circuit may be configured to perform the programming operation in response to a first access request and determine the elapsed time in response to a second access request. The second access request may be a request to program the memory cell, and the control circuit may be further configured to program the memory cell responsive to the read operation.

In some embodiments, the control circuit may be configured to update an access mark corresponding to the memory cell in conjunction with the programming operation and to determine the elapsed time based on the access mark. The control circuit may be further configured to reset the access mark responsive to a lapse of a predetermined time following updating of the access mark without an access request. The control circuit may be further configured to determine the lapse of the predetermined time by reference to the access mark. The control circuit may also be configured to generate a measure of erase operations of the memory cell and to adjust the read voltage based on the determination of the elapsed time and the measure of erase operations.

In some embodiments, the method system includes a nonvolatile memory unit comprising the plurality of memory cells and a memory controller unit configured to couple the nonvolatile memory unit to a host. The control circuit may be included in the memory controller unit and/or in the nonvolatile memory unit. The memory controller unit may include a random access memory (RAM) and a processing circuit configured to store access marks indicative of elapsed time in the RAM. In some embodiments, the control circuit may include a control logic circuit included in the nonvolatile memory unit.

BRIEF DESCRIPTION OF THE FIGURES

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIG. 4 is a diagram illustrating a distribution of changed threshold voltages of memory cells stored in which the least significant bits of FIG. 2 are stored.

FIG. 5 is a diagram illustrating a distribution of changed threshold voltages of memory cells stored in which central significant bits of FIG. 2 are stored.

FIG. 8 is a table conceptually illustrating an access mark table according to some embodiments.

FIG. 9 is a drawing illustrating the order that memory cells of each memory block are programmed.

DETAILED DESCRIPTION

Preferred embodiments of the inventive subject matter will be described below in more detail with reference to the accompanying drawings. The embodiments of the inventive subject matter may, however, be embodied in different forms and should not be constructed as limited to the embodiments set forth herein. Rather, these embodiments are provided so that this disclosure will be thorough and complete, and will fully convey the scope of the inventive subject matter to those skilled in the art. Like numbers refer to like elements throughout.

It will be understood that when an element is referred to as being "connected" or "coupled" to another element, it can be directly connected or coupled to the other element or intervening elements may be present. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Figure 1:
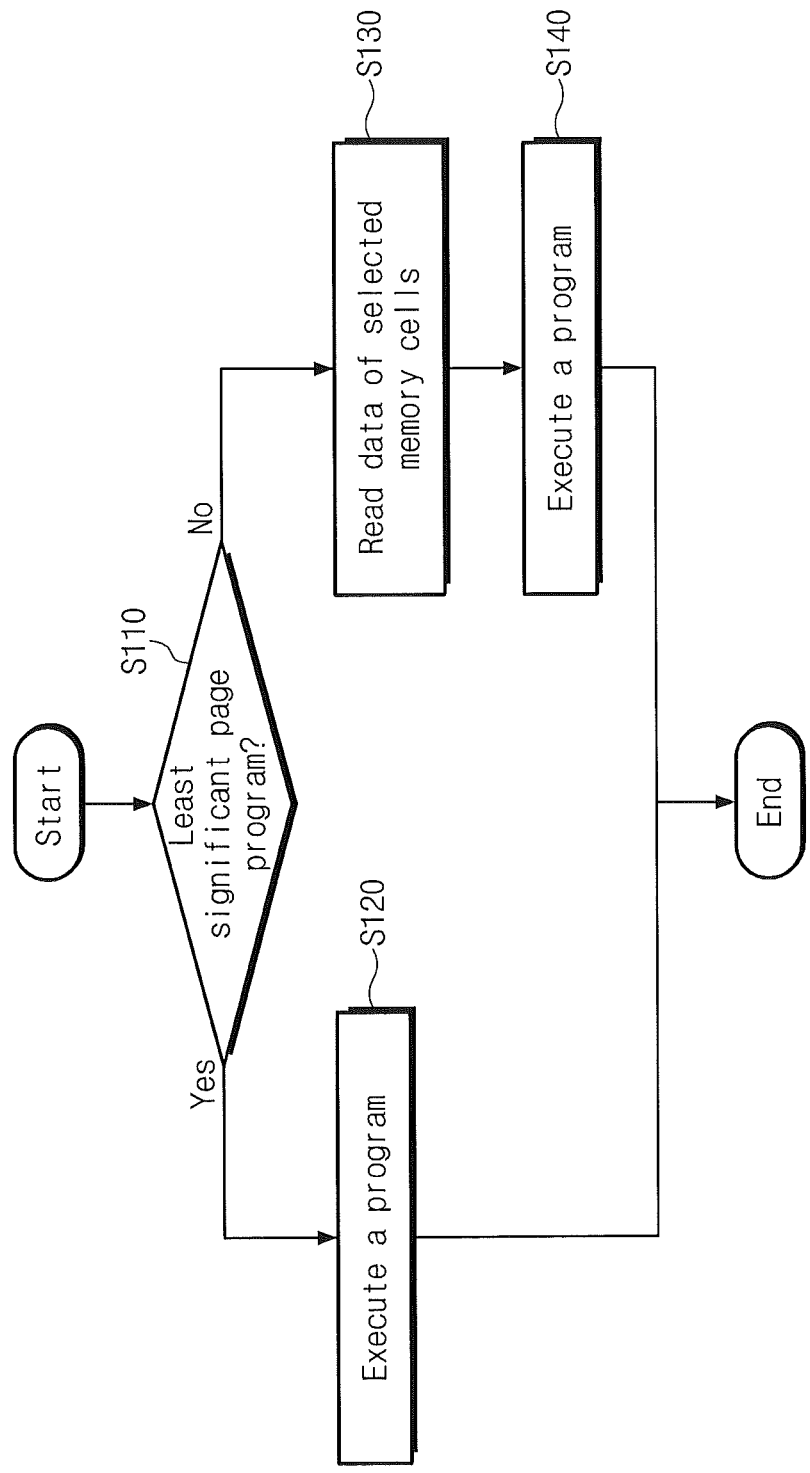
FIG. 1 is a flow chart illustrating operations for programming a nonvolatile memory.
Figure 3:
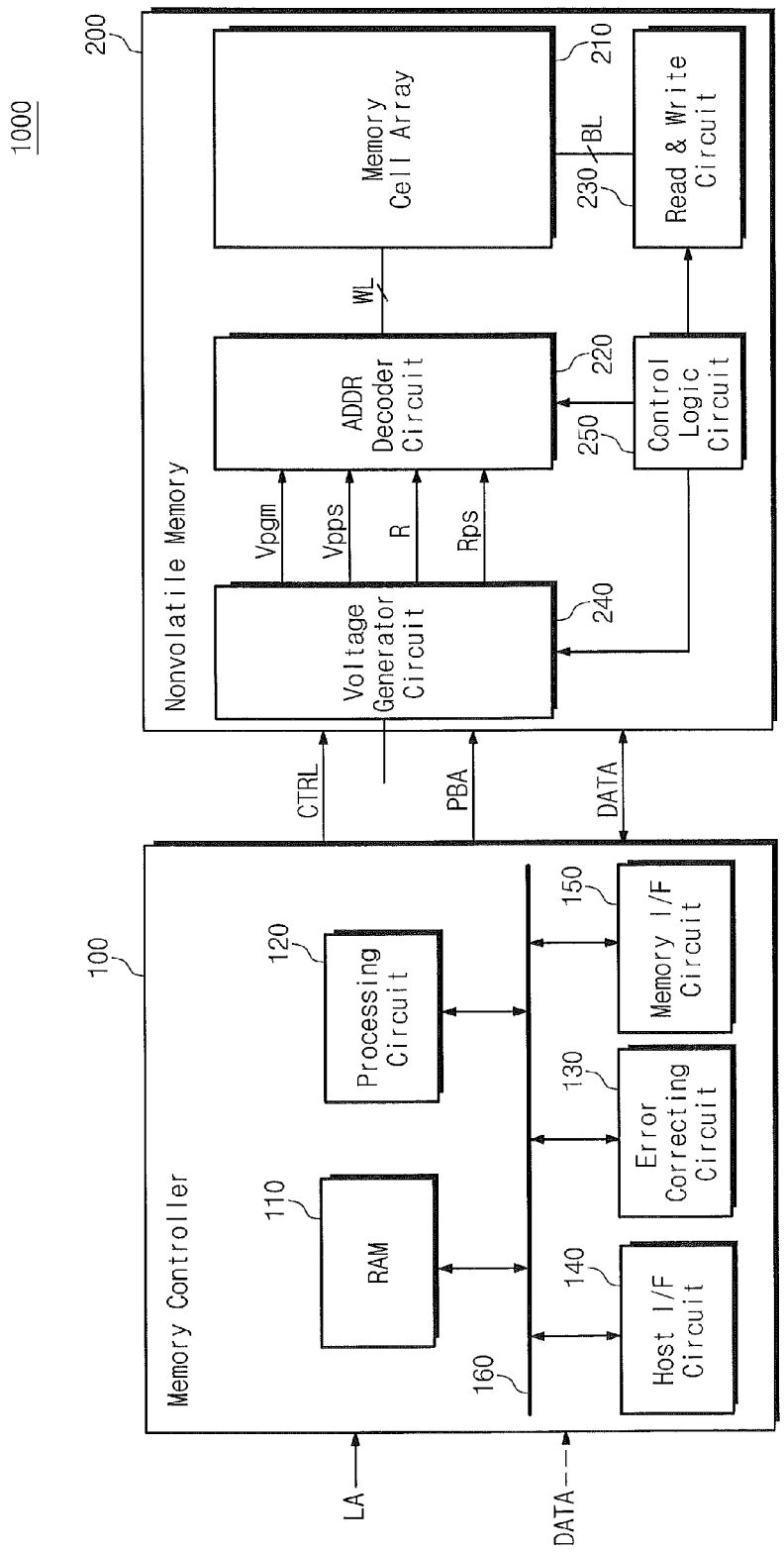
FIG. 3 is a block diagram illustrating a memory system in accordance with some embodiments of the inventive subject matter.

FIG. 1 is a flow chart illustrating operations for programming a nonvolatile memory (200 of FIG. 3). Hereinafter, it is assumed that each memory cell in the nonvolatile memory stores multi bits, that is, it is assumed that each memory cell in the nonvolatile memory a multi level cell (MLC).

Referring to FIG. 1, the nonvolatile memory determines whether a programing operation to be performed is for a least significant page (S110). The least significant page is comprised of the least significant bits (LSB) of the selected memory cells. If the programming to be performed is for the least significant page, the nonvolatile memory performs a programming operation on the selected memory cell (S120). If the programming to be performed is not for the least significant page, the nonvolatile memory reads data of the selected memory cells (S130) and performs a programming operation on the basis of the read data (S140).

Figure 2:
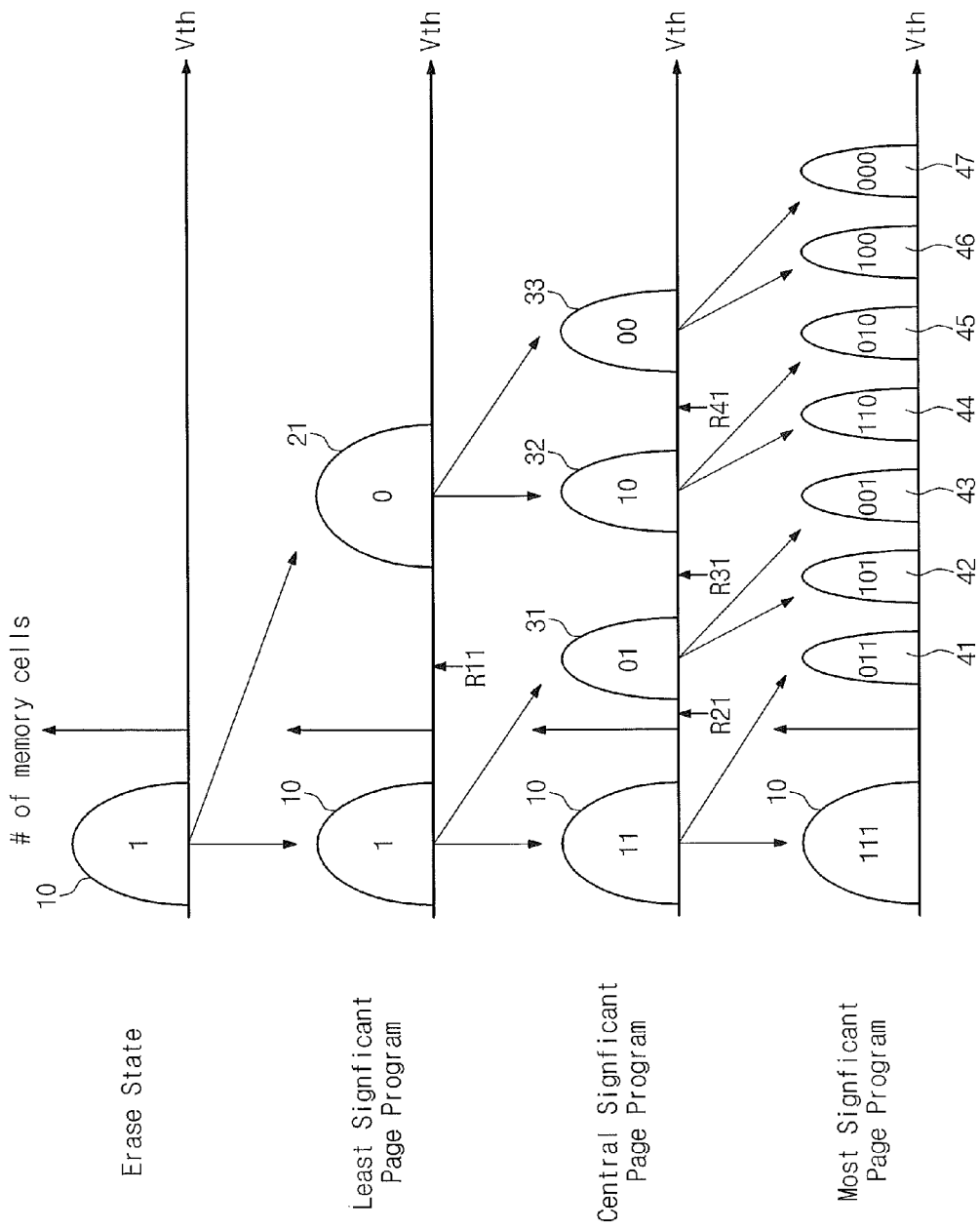
FIG. 2 is a diagram illustrating a distribution of threshold voltages of memory cells programmed by the operations illustrated in FIG. 1.

FIG. 2 is a diagram illustrating a distribution of threshold voltages of memory cells programmed by the operations illustrated in FIG. 1.

Referring to FIG. 2, a horizontal axis represents a threshold voltage (Vth) and a vertical axis represents a quantity of memory cells. If a logic value of memory cell is decided according to a threshold voltage (Vth), the horizontal axis may represent logic states of memory cells. It is assumed that each of the memory cells stores 3 bits.

As an illustration, it is assumed that the nonvolatile memory is a flash memory and the unit of read and programming operations of the nonvolatile memory is a page. However, embodiments of the inventive subject matter are not limited to a flash memory. For example, embodiments of the inventive subject matter may include ROM, PROM, EPROM, EEPROM, flash memory, PRAM, MRAM, FRAM, RRAM or the like.

If 3 bits are stored in one memory cell, memory cells sharing one word line may store data having a 3 pages size. For example, the least significant bits (LSB) stored in memory cells sharing one word line may form the least significant page. The most significant bits (MSB) stored in memory cells sharing one word line may form the most significant page. The central significant bits (CSB) stored in memory cells sharing one word line may form the central significant page.

Memory cells sharing one word line are sequentially programmed in order from the least significant page to the most significant page. Referring to FIG. 2, memory cells are programmed from an erased state 10 representing a logic value "1". When the least significant page program is performed, memory cells are programmed to the erased state 10 and a logic state 21 representing a logic value "0".

When the central significant page program is performed, the nonvolatile memory reads the least significant bits stored in the memory cells using a first read voltage R11. A logic state of each memory cell may be determined. Referring to the determined logic state, the nonvolatile memory may change a logic state of each memory cell according to the central significant bit to be stored in each memory cell. A memory cell of erased state 10 is programmed to logic states 10 and 31 representing a logic value "11" and a logic value "01" respectively. A memory cell of logic state 21 is programmed to logic states 32 and 33 representing a logic value "10" and a logic value "00" respectively.

When the most significant page program is performed, the nonvolatile memory reads the least significant bits and the central significant bits stored in memory cells using second to fourth read voltages R21, R31 and R41. Referring to the determined logic state, the nonvolatile memory may change a logic state of each memory cell according to the most significant bit to be stored in each memory cell. A memory cell of erased state 10 is programmed to logic states 10 and 41 representing a logic value "111" and a logic value "011" respectively. A memory cell of logic state 31 is programmed to logic states 42 and 43 representing a logic value "101" and a logic value "001" respectively. A memory cell of logic state 32 is programmed to logic states 44 and 45 representing a logic value "110" and a logic value "010" respectively. A memory cell of logic state 33 is programmed to logic states 46 and 47 representing a logic value "100" and a logic value "000" respectively. If a program to be programmed is not the least significant page, the nonvolatile memory reads data of the selected memory cells and performs a programming operation on the basis of the read data.

A distribution of threshold voltage of each logic state may become greater than desired due to various causes. For example, a threshold voltage level of each logic state may be increased due to a coupling between adjacent memory cells. This coupling is called "an electric field coupling" or "F-poly coupling". A threshold voltage level of each logic state may be lowered as charges accumulated in a memory cell flow into a substrate.

For example, if memory cells are in a state that the least significant page is programmed, a threshold voltage level of a part of memory cells of the logic state 21 may fall to a level lower than the first read voltage R11. When the central significant page program is performed, memory cells having the changed threshold voltage level are determined to be the erased state 10. The memory cells having the changed threshold voltage level are programmed to the logic state 10 and the logic state 31. Consequently, when the central significant page is programmed, the least significant bits of a part of the selected memory cells may be lost or changed.

If threshold voltage levels of logic states 31, 32 and 33 are reduced in a state that the least significant page and the central significant page are programmed in memory cells, when the most significant page is programmed, the least significant bits and the central significant bits of a part of the selected memory cells may be lost or changed.

FIG. 3 is a block diagram illustrating a memory system 1000 in accordance with some embodiments of the inventive subject matter. Referring to FIG. 3, the memory system 1000 includes a memory controller unit 100 and a nonvolatile memory unit 200. It will be appreciated that these units may include, for example, separate integrated circuit chips or portions of a single chip, circuit modules (e.g., circuit cards) or combinations thereof.

The memory controller unit 100 controls operation of the nonvolatile memory unit 200. The memory controller unit 100 receives an access request. When a programming operation is to be performed, the access request includes a logic address LA and data DATA. When a read operation is to be performed, an access request from a host includes a logic address LA. Hereinafter, for convenience of description, it is assumed that an access request received in the memory controller unit 100 is transmitted from the host.

The memory controller unit 100 is configured to access the nonvolatile memory unit 200 in response to an access request from the host. As an illustration, the memory controller unit 100 is configured to control read, program, erasure and background operations of the nonvolatile memory unit 200. The memory controller unit 100 is configured to execute firmware that controls the nonvolatile memory unit 200.

When a programming operation is to be performed, the memory controller unit 100 receives a logic address LA and data DATA from the host. The memory controller unit 100 may translate the logic address LA into a physical block address PBA. The memory controller unit 100 provides the physical block address PBA, the data DATA and a control signal CTRL for performing a programming operation to the nonvolatile memory unit 200.

When a read operation is to be performed, the memory controller unit 100 receives a logic address LA from the host. The memory controller unit 100 translates the logic address LA into a physical block address PBA and provides the physical block address PBA and a control signal CTRL for performing a read operation to the nonvolatile memory unit 200.

The memory controller unit 100 includes a RAM 110, a processing circuit 120, an error correction unit 130, a host interface circuit 140, a memory interface circuit 150 and a bus 160.

The RAM 110 is connected to the bus 160. The RAM 110 is controlled by the processing circuit 120. The RAM 110 stores an address mapping table. The address mapping table stores logic addresses LA, physical block addresses PBA, and a mapping between the logic address LA and the physical block address PBA.

The RAM 110 further stores an access mark table. The access mark table stores a plurality of access marks. As an illustration, each access mark may correspond to one of memory blocks of a memory array 210. Each access mark may correspond to one of pages of the memory array 210.

An access mark corresponds to time information indicating when a programming operation is performed. The RAM 110 may further store a time stamp corresponding to each access mark. The time stamp indicates when the access mark is updated.

A value of the access mark may indicate an elapsed time from when the access mark is updated. The time the access mark is updated means the time a value of the access mark is changed or maintained.

Upon power up of the memory system 100, values of the access marks of the access mark table are initialized to "0". When a first programming operation is performed, a value of the access mark corresponding to the programmed memory block is changed to "1". After that, the value of the access mark is changed according to whether a predetermined time has elapsed before a second programming operation on the block is performed. Whether the predetermined time has elapsed may be determined by the time stamp. If the memory block is not accessed after a predetermined time elapses, a value of the access mark corresponding to the memory block may be changed to "0". If the second program is performed on the memory block before this predetermined time elapses, a value of the access mark corresponding to the memory block maintains "1" and the time stamp corresponding to the maintained access mark is updated.

Values of the access marks may be periodically initialized to "0" at time other than power up of the memory system 100. A specific memory cell of the cell array 210 may be designated as an "observing" memory cell. After the observing memory cell is programmed, when a threshold voltage of the predetermined memory cell is reduced to a predetermined voltage level, values of the access marks may be initialized to "0".

The RAM 110 may include a static RAM, a dynamic RAM, a synchronous DRAM or the like. The RAM 110 may be used as an operating memory for the processing circuit 120. The RAM 110 may also be used a buffer between the nonvolatile memory unit 200 and the host. For example, when a read operation is performed, data DATA from the nonvolatile memory unit may be temporarily stored in the RAM 110 and subsequently transmitted to the host. When a programming operation is performed, data DATA from the host may be temporarily stored in the RAM 110 and subsequently provided to the nonvolatile memory unit 200.

The processing circuit 120 is connected to the RAM 110, the error correction unit 130, the host interface circuit 140, and the memory interface circuit 150 via the bus 160. The processing circuit 120 controls operation of the memory controller unit 100. For example, the processing circuit 120 manages the address mapping table of the RAM 110. The processing circuit 120 also may perform a flash translation layer (FTL) function. The processing circuit 120 may also translate the logic address LA into the physical block address PBA. The processing circuit 120 may further store information on mapping between the logic address LA and the physical block address PBA in the RAM 110.

The processing circuit 120 adjusts the read voltage R with reference to the access marks stored in the RAM 110. In the following discussion, it is assumed that the first program is performed on memory cells corresponding to the physical block address PBA at a first time and the second program is performed on the same memory cells at a second time. The second program corresponds to the central significant page program or the most significant page program. The second programming operation may include a read operation.

The processing circuit 120 determines whether or not to adjust the read voltage R of the nonvolatile memory unit 200 according to a difference between the first time and the second time. The processing circuit 120 may judge the difference between the first time and the second time with reference to the access mark table stored in the RAM 110, that is, when the logic address LA for a program is received, the processing circuit 120 may refer to a value of the corresponding access mark. If the value of the corresponding access mark is "0", the processing circuit 120 may adjust the read voltage R. The processing circuit 120 transmits information on a voltage level to the nonvolatile memory unit 200 to adjust the read voltage R. By receiving information on a voltage level, the read voltage R generated when a read operation is performed may be reset. Subsequently, the processing circuit 120 may transmit the control signal CTRL, the physical block address PBA and the data DATA that are for the second program. If the value of the corresponding access mark is "1", the processing circuit 120 does not adjust the read voltage R.

The processing circuit 120 may determine whether to adjust the read voltage R according to a value of the access mark even when a read operation is performed. It is assumed that the first program is performed on memory cells corresponding to the physical block address PBA at the first time and data of the same memory cells are read at the second time. The processing circuit 120 determines a difference between the first time and the second time with reference to a value of the access mark and may determine whether to adjust the read voltage R of the nonvolatile memory unit 200.

The read voltage R may be determined in a number of ways. Before the read voltage R is controlled, the read voltage R may be set to a default value. A level of the adjusted read voltage R may be lower than the default value by a predetermined value.

An optimum level of the read voltage R may be determined by detecting a distribution of threshold voltages of the selected memory cells using read voltages having different levels from one another. The memory controller unit 100 may detect a distribution of threshold voltages of the selected memory cells by repeating an operation of controlling the read voltage R and an operation of reading the selected memory cells in a state that the read voltage R is controlled.

Data of the selected memory cells are read using the read voltage R of the default value set before the read voltage R is controlled and the read voltage R may be determined on the basis of a quantity of error bits included in the read data. The greater a quantity of error bits, the memory controller unit 100 selects the read voltage R having a level smaller than the default value. The memory controller unit 100 may repeat an operation of controlling the read voltage R and an operation of detecting a quantity of error bits included in the read data in a state that the read voltage R is controlled until a quantity of error bits is smaller than a predetermined quantity.

The processing circuit 120 stores the address mapping table and the access mark table that are stored in the RAM 120 in the nonvolatile memory unit 200 so these values are maintained when power is off. The address mapping table and the access mark table may be stored in a predetermined block of the memory cell array 210. When a power supply is on, the processing circuit 120 copies the address mapping table and the access mark table from the nonvolatile memory unit 200 into the RAM 110. The processing circuit 120 may periodically store the address mapping table and the access mark table in the nonvolatile memory unit 200, so that they may be preserved if power is lost or turned off. The address mapping table and the access mark table are updated when the memory system 100 is activated.

The error correcting circuit 130 is configured to detect and correct error bits included in data read from the nonvolatile memory unit 200 using an error correcting code (ECC). The corrected data is transmitted to the host. The error correcting circuit 130 may provide information on a quantity of error bits to the processing circuit 120. The processing circuit 120 may adjust the read voltage R on the basis of the information on a quantity of error bits.

The host interface circuit 140 conforms to a data exchange protocol for communications between the host and the memory controller unit 100. The host interface circuit 140 transmits the logic address LA received from the host to the processing circuit 120 through the bus 160.

The host interface circuit 140 follows a protocol for performing a data exchange between the host and the memory controller unit 100. The host interface circuit 140 is configured to communicate with the outside using at least one of various interface protocols such as a universal serial bus (USB) protocol, a multimedia card (MMC) protocol, a peripheral component interconnection (PCI) protocol, a PCI-express protocol, an advanced technology attachment (ATA) protocol, a serial-ATA protocol, a parallel-ATA protocol, a small computer small interface (SCSI) protocol, an enhanced small disk interface (ESDI) protocol and an integrated drive electronics (IDE) protocol. The host interface circuit 140 may be constituted by a proprietary interface which is not the protocols described above.

The memory interface circuit 150 interfaces with the nonvolatile memory unit 200. The memory interface circuit 150 may include a NAND interface and/or a NOR interface.

The bus 160 provides at least one channel for connecting the RAM 110, the processing circuit 120, the error correcting circuit 130, the host interface circuit 140 and the memory interface circuit 150.

When a programming operation is performed, the nonvolatile memory unit 200 is configured to store data DATA according to the physical block address PBA received from the memory controller unit 100. When a read operation is performed, the nonvolatile memory unit 200 is configured to output data DATA according to the physical block address PBA received from the memory controller unit 100. The nonvolatile memory unit 200 may include at least one of ROM, PROM, EPROM, EEPROM, flash memory, PRAM, MRAM, RRAM, FRAM and so on. The nonvolatile memory unit 200 includes a memory cell array 210, an address decoder circuit 220, a read and write circuit 230, a voltage generator circuit 240 and a control logic circuit 250.

The memory cell array 210 is connected to the address decoder circuit 220 through word lines WL and connected to the read and write circuit 230 through bit lines BL. The memory cell array 210 includes a plurality of memory blocks. Each memory block includes a plurality of memory cells. Memory cells arranged in a row direction are connected to the word lines WL. Memory cells arranged in a column direction are connected to the bit lines BL. Read and programming operations of the nonvolatile memory unit 200 are performed by a page unit. An erase operation of the nonvolatile memory unit 200 is performed by a block unit.

Memory cells sharing one word line may include at least one page. If each memory cell of the memory cell array 210 stores x bit (x is an integer), memory cells sharing a word line may include x page. Hereinafter, it is assumed that each memory cell stores 3 bits. Thus, memory cells sharing a word line may include 3 pages. However, embodiments of the inventive subject matter are not limited to memory cells that store 3 bits. For example, embodiments of the inventive subject matter may utilize memory cells that store 2 bits and/or more than 3 bits.

The address decoder circuit 220 is connected to the memory cell array 210 through the word lines WL. The address decoder circuit 220 is connected to the voltage generator circuit 240. The address decoder circuit 220 operates in response to a control of the control logic circuit 250.

When a programming operation is performed, the address decoder circuit 220 receives a program voltage Vpgm and a program pass voltage Vpps from the voltage generator circuit 240. When a read operation is performed, the address decoder circuit 220 receives the read voltage R and a read pass voltage Rps from the voltage generator circuit 240.

The address decoder circuit 220 receives the physical block address PBA from the memory controller unit 100. The address decoder circuit 220 selects one page using the physical block address. When a programming operation is performed, the address decoder circuit 220 applies the program voltage Vpgm to the selected page. The address decoder circuit 220 applies the program pass voltage Vpps to unselected pages. When a read operation is performed, the address decoder circuit 220 applies the read voltage R to the selected page. The address decoder circuit 220 applies the read pass voltage Rps to unselected pages.

The address decoder circuit 220 generates a bit line select signal using the received physical block address PBA. The bit line select signal is transmitted to the read and write circuit 230.

The read and write circuit 230 is connected to the memory cell array 210 through the bit lines BL. The read and write circuit 230 operates in response to a control of the control logic circuit 250. The read and write circuit 230 is configured to exchange data DATA with the memory controller unit 100. The read and write circuit 230 selects the bit lines BL using the bit line select signal.

When the least significant page program is performed, the read and write circuit 230 receives data DATA from the memory controller unit 100 and stores the received data DATA in the selected memory cells. When the central significant page program or the most significant page program is performed, the read and write circuit 230 first reads data stored in the selected memory cells. The read and write circuit 230 changes threshold voltages of the selected memory cells according to data DATA to be programmed with reference to the read data.

When a read operation is performed, the read and write circuit 230 reads data from the memory cell array 210 and outputs the read data to the memory controller unit 100.

The read and write circuit 230 may include constituent elements such as a sense amplifier, a write driver, a page buffer, a column select circuit and a data buffer.

The voltage generator circuit 240 is connected to the address decoder circuit 220 and the control logic circuit 250. The voltage generator circuit 240 operates in response to a control of the control logic circuit 250. The voltage generator circuit 240 generates the program voltage Vpgm, the program pass voltage Vpps, the read voltage R and the read pass voltage Rps by receiving a power supply voltage and boosting the power supply voltage. The voltage generator circuit 240 may boost the power supply voltage using a plurality of capacitors (not illustrated).

When a programming operation is performed, the voltage generator circuit 240 provides the program voltage Vpgm and the program pass voltage Vpps to the address decoder circuit 220 in response to a control of the control logic circuit 250.

When a read operation is performed, the voltage generator circuit 240 provides the read voltage R and the read pass voltage Rps to the address decoder circuit 220 in response to a control of the control logic circuit 250.

The voltage generator circuit 240 may be reset to generate a changed read voltage R. The voltage generator circuit 240 may be reset according to a control of the control logic circuit 250. When a read operation is performed after the voltage generator circuit 240 is reset, the voltage generator circuit 240 generates the read pass voltage Rps and the changed read voltage R.

The control logic circuit 250 is connected to the address decoder circuit 220, the read and write circuit 230 and the voltage generator circuit 240. The control logic circuit 250 is configured to control the whole operation of the nonvolatile memory unit 200. The control logic circuit 250 operates in response to a control signal CTRL received from the memory controller unit 100.

The control logic circuit 250 resets the voltage generator circuit 240 in response to a control of the memory controller unit 100 so that the read voltage R is changed. The control logic circuit 250 may receive voltage level information from the memory controller unit 100. According to the received voltage level information, the control logic circuit 250 resets the voltage generator circuit 240 so that the read voltage R is changed.

FIG. 4 is a diagram illustrating a distribution of changed threshold voltages of memory cells stored in which the least significant bits of FIG. 2 are stored. A distribution of threshold voltage of each logic state may change to a distribution of threshold voltage wider than a desired window as time passes. Referring to FIG. 4, a distribution of threshold voltages of memory cells programmed to an erased state 10 may change to a first voltage distribution 16. A distribution of threshold voltages of memory cells programmed to a logic state 21 may change to a second voltage distribution 26.

Parts of the memory cells of the second voltage distribution 26 have threshold voltages lower than a first read voltage R11. When a read operation is performed using the first read voltage R11, parts of the memory cells of the second voltage distribution 26 may be read as a logic value "1". The memory controller unit 100 may control the nonvolatile memory unit 200 so that a read operation is performed using a changed first read voltage R12.

FIG. 5 is a diagram illustrating a distribution of changed threshold voltages of memory cells stored in which central significant bits of FIG. 2 are stored. Referring to FIG. 5, logic states 31, 32 and 33 are changed to third, fourth and fifth voltage distributions 36, 37 and 38 respectively. When a read operation is performed using second, third and fourth read voltages R21, R31 and R41, read data may include errors. The memory controller unit 100 may control the nonvolatile memory unit 200 so that a read operation is performed using changed read voltages R22, R32 and R42.

According to some embodiments of the inventive subject matter, the memory controller unit 100 adjusts the read voltage level of the nonvolatile memory unit 200. According to a controlled read voltage level, the nonvolatile memory unit 200 performs a read operation. Error bits included in the read data may be reduced. Thus, the memory system 1000 having improved reliability may be provided.

Figure 6:
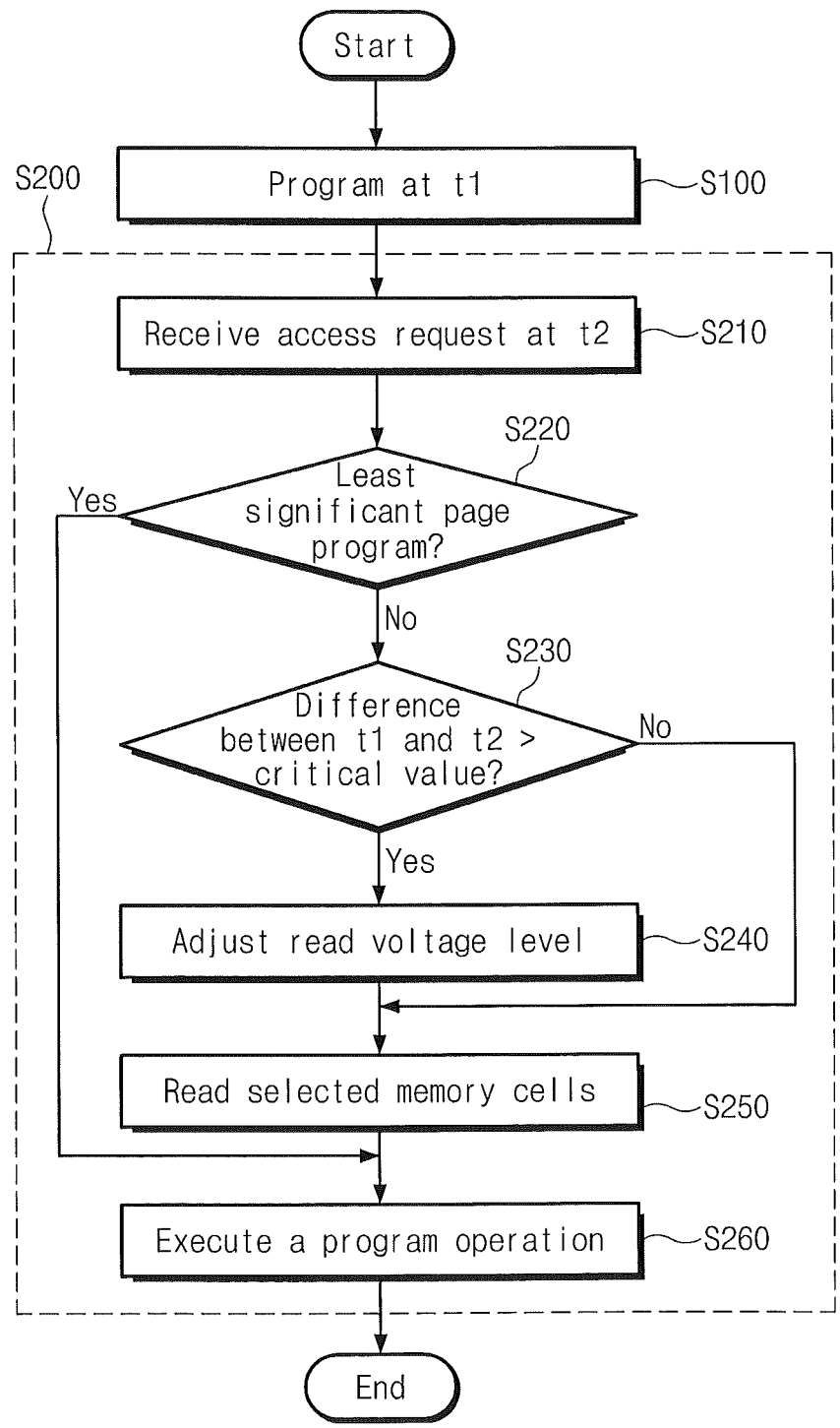
FIG. 6 is a flow chart illustrating operations in accordance with some embodiments of the inventive subject matter.

FIG. 6 is a flow chart illustrating programming operations in accordance with some embodiments of the inventive subject matter. Referring to FIGS. 3 and 6, in a step S100, a programming operation is performed on memory cells selected at first time t1. The programming in the step S100 may be performed using the same operations as a second programming operation of a step S200. The first time t1 means a time at which a programming operation is performed. The first time t1 means a specific time of the time required to perform a program. For example, the first time t1 may mean a time changing an access mark to 1 or maintaining the access mark when a programming operation is performed.

In the step S200, a programming operation is performed on the selected memory cells. For example, in the step S100, the least significant page program is performed on the selected memory cells and in the step S200, the central significant page program is programmed on the same memory cells. In the step S100, the central significant page program may be performed on the selected memory cells and in the step S200, the most significant page program may be programmed on the same memory cells.

The step S200 includes steps of S210 through S260. In a step S210, an access request is received from the host at the second time t2. When a programming operation is performed, the memory controller unit 100 receives the logic address LA and the data DATA from the host. In FIG. 6, the second time t2 is a time at which an access request is received. However, it is only an illustration and the second time t2 may mean a specific time of the time during which the steps S210 through S230 are performed.

In a step S220, the memory controller unit 100 determines whether a programming to be performed is for a least significant page. If programming for a least significant page program is to be performed, a step S260 is performed, that is, a programming operation is performed without a read operation. If a program to be performed is not for the least significant page program, a step S230 is performed.

In the step S230, the memory controller unit 100 determines a difference between the first time and the second time and it decides whether to adjust the read voltage R depending on the difference. A difference between the first time and the second time may be determined in various ways. A difference between the first time and the second time may be determined with reference to the access mark table. If the difference between the first time and the second time is greater than a predetermined critical value, a step S240 is performed. If the difference between the first time and the second time is equal to or less than the predetermined critical value, a step S250 is performed.

In the step S240, the memory controller unit 100 adjusts the read voltage R. The memory controller unit 100 may determine a level of the controlled read voltage R. The memory controller unit 100 may reset the nonvolatile memory unit 200 so that a read voltage R with a determined level is generated when a read operation is performed.

The memory controller unit 100 transmits voltage level information to the nonvolatile memory unit 200. The control logic circuit 250 controls the voltage generator circuit 240 so that the read voltage R is controlled according to the voltage level information. The voltage generator circuit 240 providing the first read voltage R11 in FIG. 4 is controlled to provide a changed read voltage R12. The voltage generator circuit 240 providing second, third and fourth read voltages R21, R31 and R41 in FIG. 5 is controlled to generate changed second, third and fourth voltages R22, R32 and R42.

In the step S250, the nonvolatile memory unit 200 reads the selected memory cells under control of the memory controller unit 100. The memory controller unit 100 may transmit a control signal CTRL, a physical block address PBA and data DATA that are for a programming operation. The nonvolatile memory unit 200 reads data of memory cells selected before a programming operation is performed (S260).

In the step S260, the nonvolatile memory unit 200 performs a programming operation on the basis of the read data. That is, the nonvolatile memory unit 200 programs each memory cell so that each memory cell has a logic state corresponding to a logic value to be stored therein. In the case that the least significant page program is performed, the nonvolatile memory unit 200 programs each memory so as to have a logic state corresponding to a logic value to be stored without a read operation.

After a programming operation is over (after the step S260), the memory controller unit 100 may control the nonvolatile memory unit 200 so that the read voltage R before changed is generated from the voltage generator circuit 240.

Figure 7:
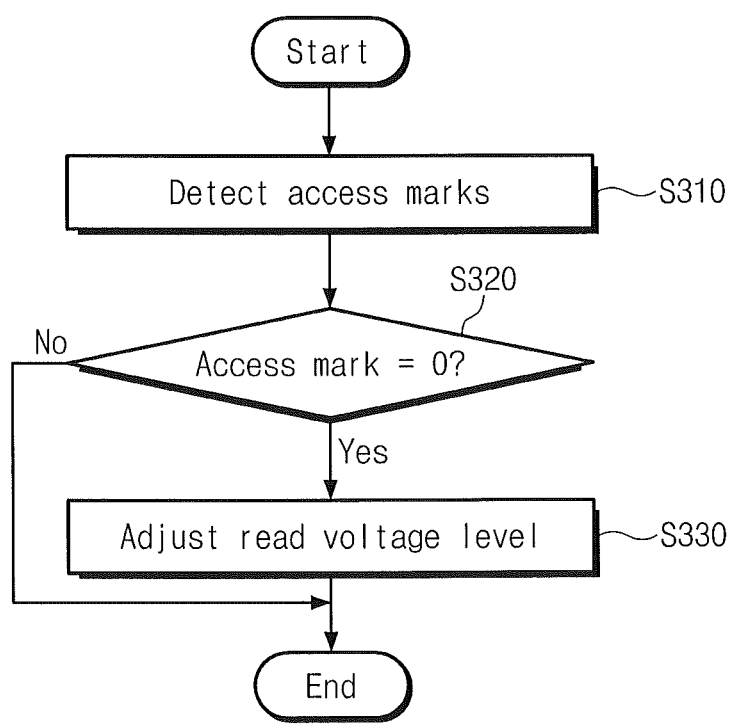
FIG. 7 is a flow chart illustrating operations for determining a read voltage level according to some embodiments.

FIG. 7 is a flow chart illustrating operations for determining a read voltage level according to some embodiments. The flow chart of FIG. 7 illustrates the steps S230 and S240 of FIG. 6 in more detail. FIG. 8 is a table conceptually illustrating an access mark table according to some embodiments. FIG. 9 is a drawing illustrating the order that memory cells of each memory block are programmed according to some embodiments.

Referring to FIGS. 3, 6, 7 and 9, in a step S310, the processing circuit 120 detects access marks. In a step S320, the processing circuit 120 determines whether a value of the access mark is "0". An access mark value of "0" indicates that a predetermined time passed after a programming operation. If this is the case, a step S330, in which the read voltage R is adjusted, is performed. If a value of the access mark is "1", the read voltage R is not controlled.

In some embodiments, there may be at least one access mark corresponding to each memory block of the memory cell array 210. Referring to FIG. 8, first and second access marks AM1 and AM2 are provided for each memory block. The first access mark AM1 may be changed or maintained when the least significant page program is performed on any one page of each memory block. The second access mark AM2 may be changed or maintained when the central significant page program is performed on any one page of each memory block. When the access mark is changed or maintained, a time stamp corresponding to the changed or maintained access mark is updated.

After the first and second access marks AM1 and AM2 corresponding to each memory block are changed or maintained respectively according to a programming operation, if a subsequent programming operation is not performed before a predetermined time passes, the first and second access marks AM1 and AM2 are changed to "0". Thus, a value of the access mark corresponds to the elapsed time from when a programming operation is most recently performed.

The processing circuit 120 identifies a memory block corresponding to the physical block address PBA and the processing circuit 120 refers to one of the first and second access marks AM1 and AM2 corresponding to the determined memory block. If a program to be performed is determined to be the most significant page program according to the physical block address PBA, the processing circuit 120 identifies a memory block corresponding to the physical block address PBA. Between the access marks of the identified memory block, a value of the second access mark AM2 is referred that corresponds to the central significant page which is a lower page only to the most significant page.

If the processing circuit 120 identifies a program to be performed to be the central page program according to the physical block address PBA, the processing circuit 120 refers to a value of the first access mark AM1 corresponding to the least significant page which is a lower page only to the central significant page. That is, when the central significant page program is performed, a value of the first access mark AM1 is referred that represents a time at which the least significant page program is performed.

The access mark table is not limited to the embodiments of FIG. 8. That is, the access mark table may be implemented in other ways. The access marks included in the access mark table may correspond to pages of the nonvolatile memory unit 200, respectively.

In FIG. 9, a programming order for memory cells in one memory block is described. The numbers shown in the table of FIG. 9 indicate the programming order. In description that references FIG. 9, for convenience of description, it is assumed that 0th through 4th word lines WL0~WL4 are connected to one memory block.

The least significant page of memory cells of the 0th word line WL0 is programmed in the order of 0th and the least significant page of memory cells of the first word line WL1 is first programmed. The central significant page of memory cells of the 0th word line WL0 is subsequently programmed and the least significant page of memory cells of the second word line WL2 is programmed afterwards. After that, the central significant page of memory cells of the first word line WL1 is programmed. The most significant page of memory cells of the 0th word line WL0 is subsequently programmed. In this manner, memory cells connected to 0th through 4th word lines WL0~WL4 are programmed.

According to the programming order, the central page program is performed on the memory cells on which the least significant page program is most recently performed among the memory cells on which the least significant page program is performed. After the least significant page of memory cells of the 0th word line WL0 is programmed, the firstly performed central significant page program is performed on memory cells of the 0th word line WL0.

A value of the first access mark AM1 is changed or maintained when the most recent least significant page program is performed. Thus, a value of the first access mark AM1 when the central page program is performed is the value which is changed or maintained when the least significant page program is performed on memory cells on which the central significant page program will be performed. With reference to the value of the first access mark AM1, the elapsed time from when the least significant page program is performed on the selected memory cells to when the central significant page is performed is determined.

It is assumed that the selected memory cells are connected to the 0th word line WL0 of the 0th memory block BLK0. When the least significant page is performed on memory cells of the 0th word line WL0, the first access mark AM1 is changed to "1". After that, the central significant page program which is the first to be performed on the 0th memory block BLK0 will be performed on the memory cells of the 0th word line WL0. With reference to a value of the first access mark AM1 corresponding to the 0th memory block BLK0, it may be determined whether the elapsed time from when the least significant page program of the memory cells of the 0th word line WL0 is performed is greater than a critical time.

The most significant page program is performed on memory cells on which the central significant page program is most recently performed. After the central significant page of memory cells of the 0th word line WL0 is programmed, the firstly performed most significant page program is performed on memory cells of the 0th word line WL0. A value of the second access mark AM2 is the value which is changed or maintained when the least significant page program is performed on memory cells on which the most significant page program will be performed. When the most significant page program is performed, with reference to the value of the second access mark AM2, the elapsed time from when the central significant page program is performed on the memory cells selected when the most significant page program is performed is determined.

Consequently, according to the program order, a quantity of access marks corresponding to each memory block is only two.

Referring back to FIG. 7, in the step S330, the processing circuit 120 adjusts the read voltage R of the nonvolatile memory unit 200.

After a programming operation is performed (after the step S260 of FIG. 6), a value of the access mark may be changed to "1" or maintained. In the case that the least significant page program is performed, the first access mark AM1 corresponding to the programmed memory block is changed to "1". In the case that the central significant page program is performed, the second access mark AM2 corresponding to the programmed memory block is changed to "1" or maintained.

Figure 10:
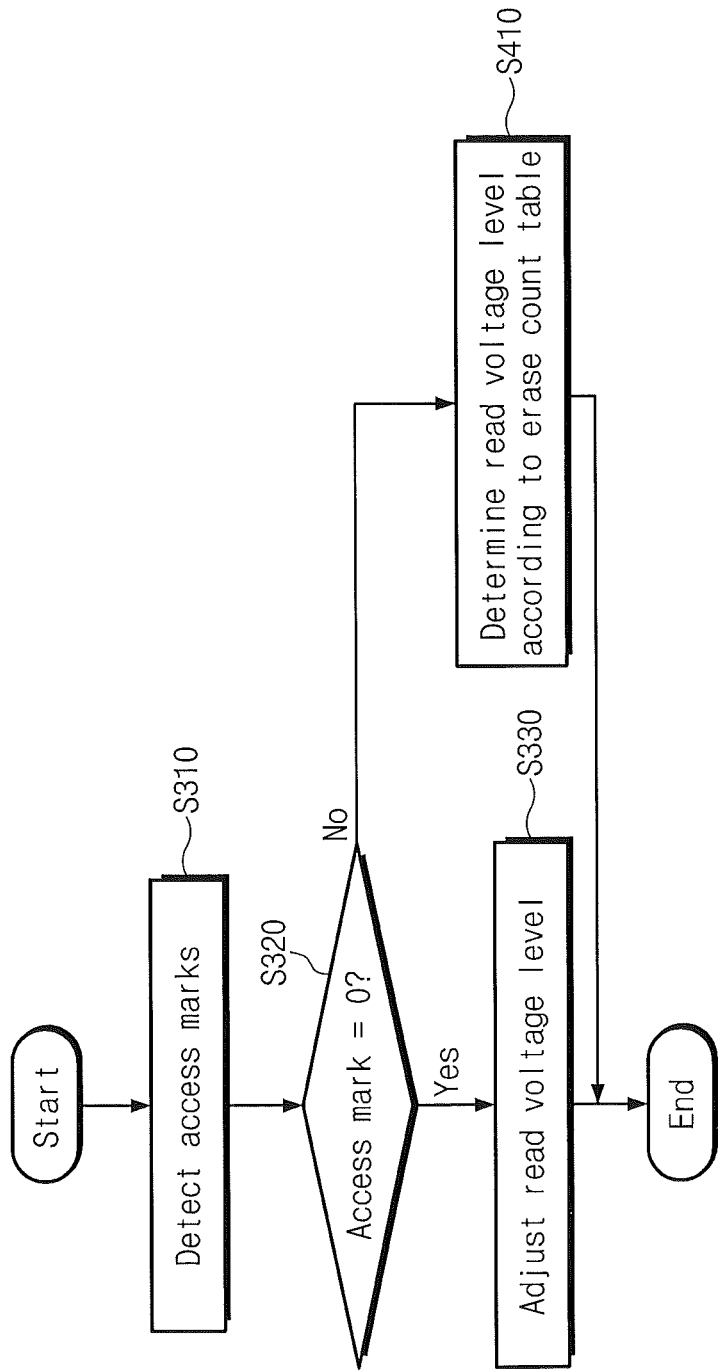
FIG. 10 is a flow chart illustrating operations for deciding a read voltage level according to some embodiments.

FIG. 10 is a flow chart illustrating operations for determining a read voltage level according to some embodiments. Referring to FIGS. 3, 7 and 10, these embodiments further includes a step S410. For such embodiments, the RAM 110 of FIG. 3 may further store an erase count table. The erase count table includes an erase count value corresponding to each memory block of the nonvolatile memory unit 200. Whenever an erase operation is performed, the processing circuit 120 increases an erase count value corresponding to a memory block on which the erase operation is performed.

While programming operations and erase operations are performed, a distribution of threshold voltages for each logic state may change such that the distributions of particular threshold voltages are broader than desired. In particular, while programming operations and erase operations are repeatedly performed, effects from electric field coupling or F-poly coupling increase. In addition, leakage of charges stored in memory cells into the substrate may increase.

Referring to FIG. 10, if a value of the access mark is "0", the step S410 is performed. In the step S410, the processing circuit 120 determines a read voltage level according to the erase count table.

The processing circuit 120 may adjust the read voltage R according to an erase count value corresponding to the selected memory block. The processing circuit 120 controls the nonvolatile memory unit 200 so that the read voltage R increases or decreases according to an erase count value. Even in the case that a value of the access mark is "0", reliability of read operation may be improved by adjusting the read voltage R according to an erase count value.

Figure 11:
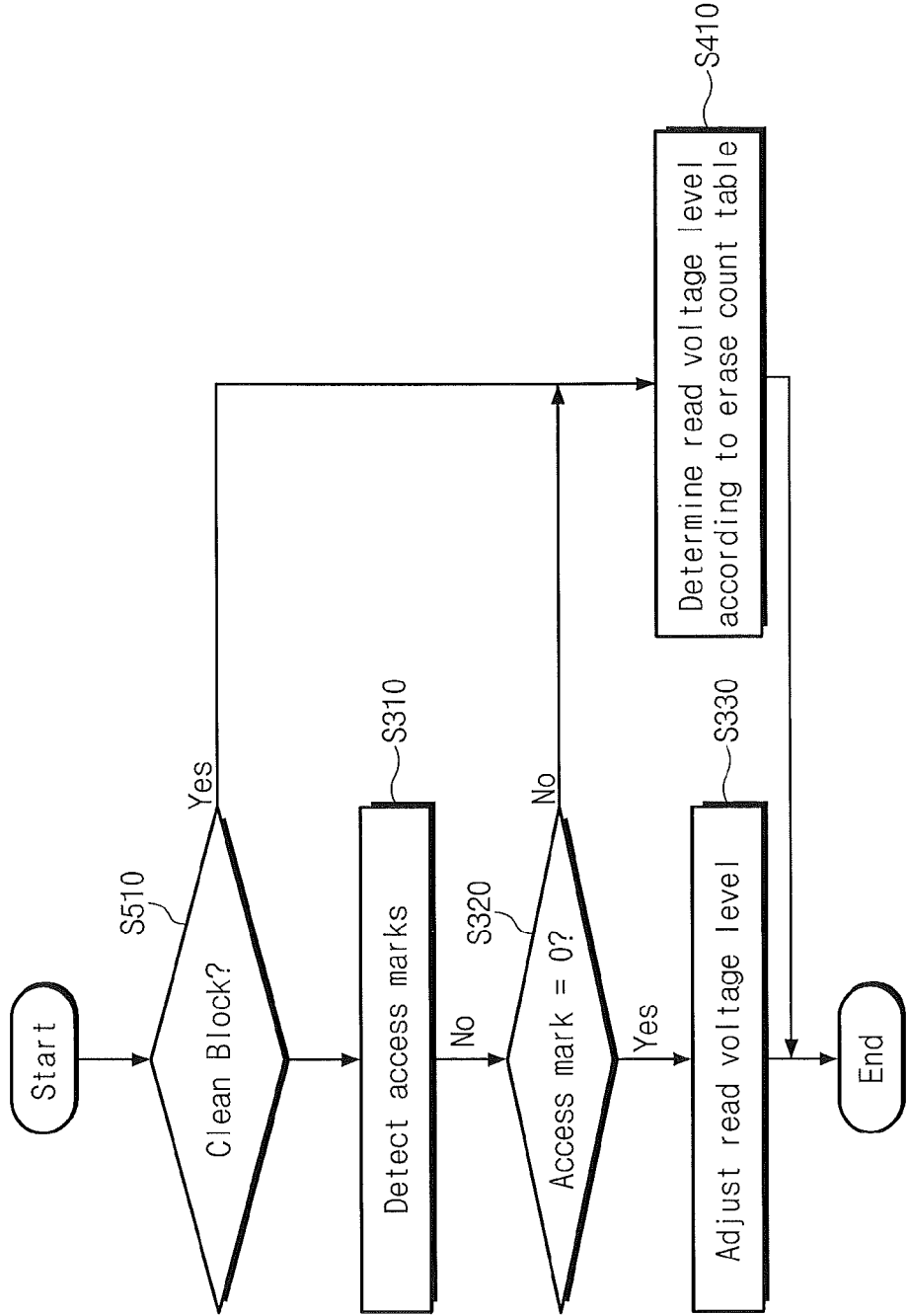
FIG. 11 is a flow chart illustrating operations for deciding a read voltage level according to further embodiments.

FIG. 11 is a flow chart illustrating operations for determining a read voltage level according to further embodiments. Referring to FIGS. 3, 10 and 11, the third embodiment further includes a step S510 as compared with FIG. 10. Hereinafter, descriptions of overlapped parts with the aforementioned embodiment may be omitted.

After the physical block address PBA is generated, the processing circuit 120 determines whether a memory block corresponding to the physical block address is a clean block, i.e., a memory block in which data has yet to be stored. The processing circuit 120 determines whether a memory block corresponding to the physical block address is a clean block with reference to an address mapping table stored in the RAM 110. A step S320 and a step S410 may be selectively performed according to whether a memory block corresponding to the physical block address is a clean block.

Figure 12:
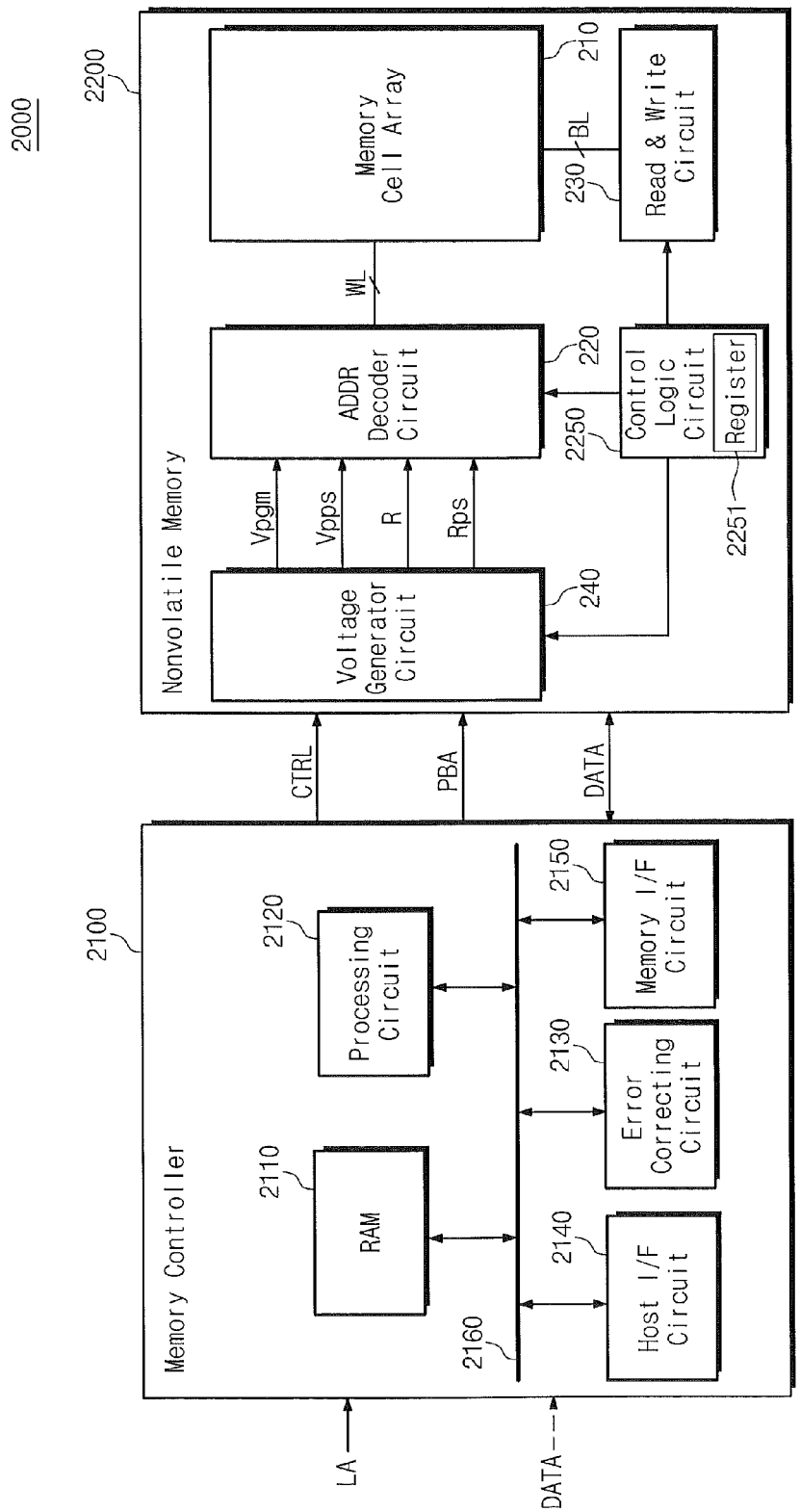
FIG. 12 is a block diagram illustrating a memory system in accordance with some embodiments of the inventive subject matter.

FIG. 12 is a block diagram illustrating a memory system 2000 in accordance with further embodiments of the inventive subject matter. Referring to FIG. 12, the memory system 2000 includes a memory controller unit 2100 and a nonvolatile memory unit 2200. It will be appreciated that these units may include, for example, separate integrated circuit chips or portions of a single chip, circuit modules (e.g., circuit cards) or combinations thereof.

The nonvolatile memory unit 2200 may be substantially the same as the nonvolatile memory unit 200 of FIG. 3, with like components indicated by like reference numerals. The nonvolatile memory unit 200 further includes control logic circuit 2250, including a register 2251. The memory controller unit 2100 includes a RAM 2110, a processing circuit 2120, a host interface circuit 2140, an error correcting circuit 2130 and a memory interface circuit 2150, and some components thereof may be substantially the same as the memory controller unit 100 of FIG. 3, except that the memory controller unit 2100 need not be able to directly adjust the read voltage level.

Determination of whether to adjust a read voltage R and adjustment of the read voltage R is performed in the control logic circuit 2250 of the nonvolatile memory unit 2200. The register 2251 stores an access mark table. The control logic circuit 2250 updates an access mark of the access mark table whenever a program is performed.

When a programming operation is performed, the nonvolatile memory unit 2200 receives a control signal CTRL, a physical block address PBA and data DATA from the memory controller unit 2100. According to the physical block address PBA, the control logic circuit 2250 determines whether a program to be performed is the least significant page program. If a program to be performed is the least significant page program, a read operation is not performed before a programming operation.

If a program to be performed is not the least significant page program, the control logic circuit 2250 determines whether to adjust the read voltage R with reference to the access mark table. According to the determined results, the control logic circuit 2250 resets a voltage generator circuit 240 so that a read voltage R of changed level is generated when a read operation is performed.

Figure 13:
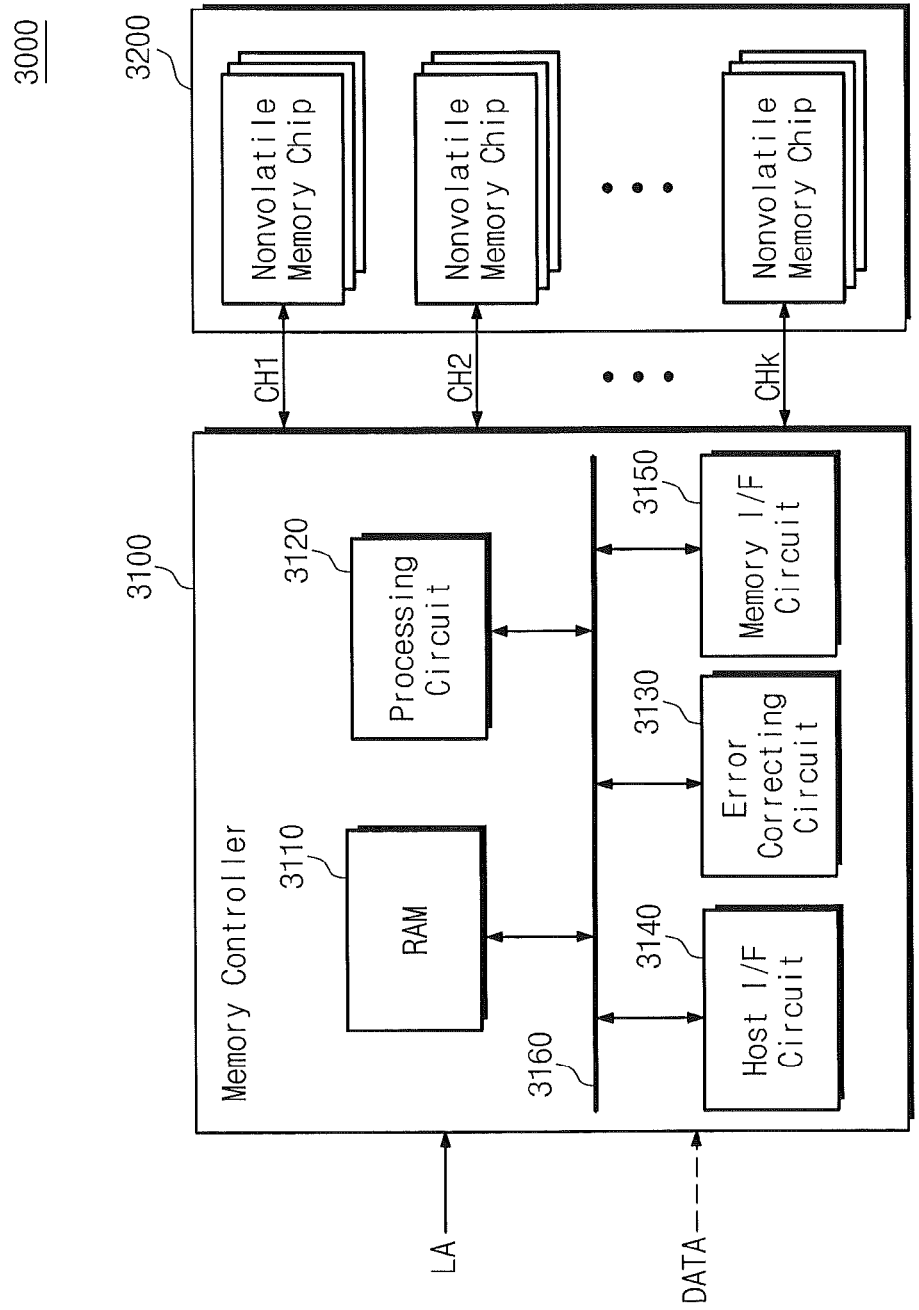
FIG. 13 is a block diagram illustrating an application of the memory system of FIG. 3.

FIG. 13 is a block diagram illustrating a memory system 3000 as an application example for the memory system 1000 of FIG. 3. Referring to FIG. 13, the memory system 3000 includes a memory controller unit 3100 and a nonvolatile memory unit 3200. It will be appreciated that these units may include, for example, separate integrated circuit chips or portions of a single chip, circuit modules (e.g., circuit cards) or combinations thereof.

The memory controller unit 3100 includes a RAM 3110, a processing circuit 3120, a host interface circuit 3140, an error correcting circuit 3130 and a memory interface circuit 3150. The nonvolatile memory unit 3200 includes a plurality of nonvolatile memory chips. The plurality of nonvolatile memory chips is divided into groups. Each group is configured to communicate with the memory controller unit 3100 through one common channel. It is illustrated that the plurality of nonvolatile memory chips communicates with the memory controller unit 3100 through first through kth channels CH1~CHk. Each of the nonvolatile memory chips may be constituted to be the same with the nonvolatile memory unit 200 of FIG. 3 and may operate in the same manner as the nonvolatile memory unit 200. Each nonvolatile memory chip is configured to include 0th through zth memory blocks.

The memory controller unit 3100 may operates in substantially the same manner as the memory controller unit 100 of FIG. 3. According to the access mark table, when a programming operation is performed on each nonvolatile memory chip, the memory controller unit 3100 determines whether to adjust a read voltage level and adjusts the read voltage level.

The memory controller unit 3100 may manage erase and programming operations of the nonvolatile memory chips connected to different channels from one another in common. At this time, the memory controller unit 3100 stores an access mark table for managing read voltages of the nonvolatile memory chips in common.

When an erase operation is performed, 0th memory block of each nonvolatile memory chip connected to other channel may be erased in common. Thus, an erase counter corresponding to each memory block may be managed in common. When a programming operation is performed, 0th memory block of each nonvolatile memory chip connected to other channel may be programmed in common. Thus, an access mark corresponding to each memory block may be managed in common.

In FIG. 13, it is illustrated that a plurality of nonvolatile memory chips is connected to one channel. However, the memory system 3000 may be changed so that one nonvolatile memory chip is connected to one channel.

Figure 14:
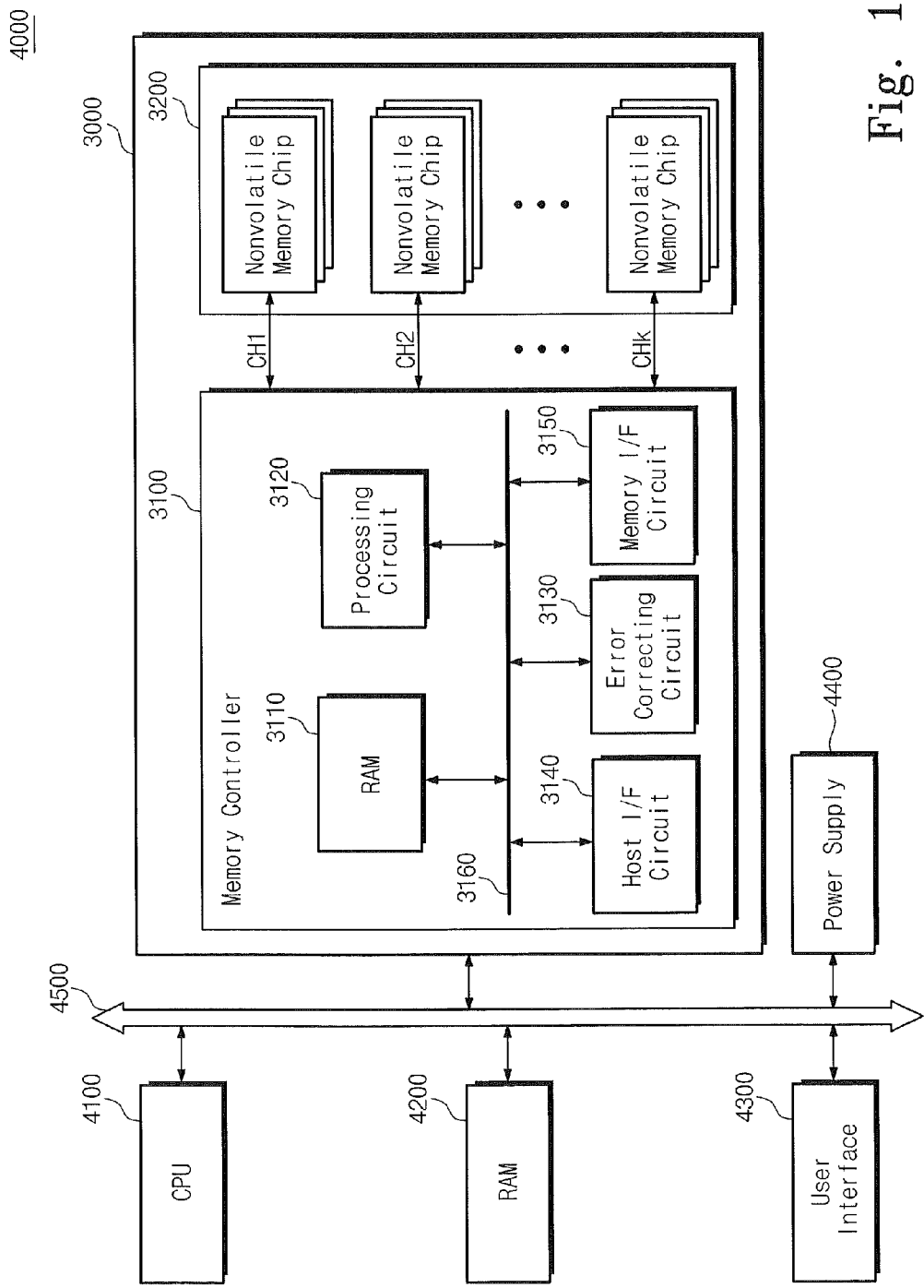
FIG. 14 is a block diagram illustrating a computing system including a memory system described with reference to FIG. 13.

FIG. 14 is a block diagram illustrating a computing system 4000 including a memory system 3000 described with reference to FIG. 13. Referring to FIG. 14, the computing system 4000 includes a central processing circuit 4100, a RAM 4200, a user interface 4300, a power supply 4400, a system bus 4500 and the memory system 3000.

The memory system 3000 is electrically connected to the central processing circuit 4100, the RAM 4200, the user interface 4300, and the power supply 4400 through the system bus 4500. Data provided through the user interface 4300 or processed by the central processing circuit 4100 is stored in the memory system 3000.

In FIG. 14, it is illustrated that a nonvolatile memory unit 3200 is connected to the system bus 4500 through a memory controller unit 3100. However, the nonvolatile memory unit 3200 may be configured to be directly connected to the system bus 4500. At this time, a function of a processing circuit 3120 is performed by the central processing circuit 4100. A function of a RAM 3110 is performed by the RAM 4200.

In FIG. 14, it is illustrated that the memory system 3000 described with reference to FIG. 13 is provided. However, the memory system 3000 may be substituted with the memory system 1000 described with reference to FIG. 3.

The computing system 4000 may be configured to include the memory systems 1000 and 3000 described with reference to FIGS. 3 and 13.

According to some embodiments of the inventive subject matter, a read voltage level of a nonvolatile memory is adjusted based on an elapsed time with respect to a prior programming operation. The read voltage level of the nonvolatile memory may be adjusted to an optimum read voltage level. According to the adjusted read voltage level, the nonvolatile memory performs a read operation. Errors in read data bits may be reduced. Thus, a memory system having improved reliability may be provided.

Although a few embodiments of the present general inventive subject matter have been shown and described, it will be appreciated by those skilled in the art that changes may be made in these embodiments without departing from the principles and spirit of the general inventive subject matter, the scope of which is defined in the appended claims and their equivalents. Therefore, the above-disclosed subject matter is to be considered illustrative, and not restrictive.

What is claimed is:

1. A method comprising:
performing a programming operation on selected memory cells of a nonvolatile memory in response to a first access request;
determining an elapsed time from the programming operation in response to a second access request;
adjusting a read voltage level based on the determined elapsed time; and
performing a read operation on the selected memory cells using the adjusted read voltage level,
wherein the second access request is a request to program the selected memory cells and
wherein the method further comprises programming the selected memory cells responsive to the read operation.

2. The method of claim 1, wherein adjusting the read voltage level comprises adjusting the read voltage level when the elapsed time is greater than a critical value.

3. The method of claim 1, further comprising updating an access mark corresponding to the selected memory cells in conjunction with the programming operation and
wherein determining the elapsed time from the programming operation in the second access request comprises determining the elapsed time based on the access mark.

4. The method of claim 3, further comprising resetting the access mark responsive to a lapse of a predetermined time following the updating of the access mark without an access request.

5. The method of claim 4, further comprising determining the lapse of the predetermined time by reference to the access mark.

6. The method of claim 4, wherein adjusting the read voltage level based on the determined elapsed time comprises controlling the read voltage level based on whether the access mark is initialized.

7. The method of claim 1, further comprising generating a measure of erase operations of the selected memory cells and wherein adjusting the read voltage level of the nonvolatile memory based on the determination of the elapsed time comprises adjusting the read voltage level based on the determined elapsed time and the measure of erase operations.

8. A memory system comprising:
a nonvolatile memory including a plurality of memory cells; and
a control circuit configured to perform a programming operation on selected memory cells in response to a first access request, to determine an elapsed time from the programming operation in response to a second access request, to adjust a read voltage level based on the determined elapsed time, and to perform a read operation on the selected memory cells using the adjusted read voltage level,
wherein the second access request is a request to program the selected memory cells and
wherein the control circuit is further configured to program the selected memory cells responsive to the read operation.

9. The memory system of claim 8, wherein the control circuit is configured to update an access mark corresponding to the selected memory cells in conjunction with the programming operation and to determine the elapsed time based on the access mark.

10. The memory system of claim 9, wherein the control circuit is further configured to reset the access mark responsive to a lapse of a predetermined time following updating of the access mark without an access request.

11. The memory system of claim 10, wherein the control circuit is further configured to determine the lapse of the predetermined time by reference to the access mark.

12. The memory system of claim 8, wherein the control circuit is configured to generate a measure of erase operations of the selected memory cells and to adjust the read voltage level based on the determination of the elapsed time and the measure of erase operations.

13. The memory system of claim 8, comprising a nonvolatile memory unit comprising the plurality of memory cells and a memory controller unit configured to couple the nonvolatile memory unit to a host, and wherein the control circuit is included in the memory controller unit and/or in the nonvolatile memory unit.

14. The memory system of claim 13, wherein the memory controller unit comprises a random access memory (RAM) and a processing circuit configured to store access marks indicative of elapsed time in the RAM.

15. A memory system comprising:
a nonvolatile memory device comprising a first memory cell and a second memory cell; and
a memory controller in signal communication with the nonvolatile memory device,
wherein the memory controller is configured to update an access mark, corresponding to the first memory cells, stored in the second memory cells in conjunction with a programming operation on the first memory cell, to determine an elapsed time from the programming operation with reference to the access mark,
wherein the memory controller adjusts a read voltage level of the first memory cell based on the elapsed time.

* * * * *